United States Patent

Schneider et al.

[11] Patent Number: 5,899,265
[45] Date of Patent: May 4, 1999

[54] REFLUX COOLER COUPLED WITH HEAT PIPES TO ENHANCE LOAD-SHARING

[75] Inventors: Michael G. Schneider, Roscoe; Timothy Bland, deceased, late of Rockford, both of Ill., by Katharine C. Bland, executrix

[73] Assignee: Sundstrand Corporation, Rockford, Ill.

[21] Appl. No.: 08/841,956

[22] Filed: Apr. 8, 1997

[51] Int. Cl.⁶ .................................................. F28D 15/00
[52] U.S. Cl. ............................... 165/104.33; 165/104.26; 165/104.21; 165/104.13
[58] Field of Search .................. 165/104.14, 104.21, 165/104.26, 104.33, 104.34

[56] References Cited

U.S. PATENT DOCUMENTS

| | | | |
|---|---|---|---|
| 4,036,291 | 7/1977 | Kobayashi et al. | 165/104.21 |
| 4,830,100 | 5/1989 | Kato et al. | 165/104.14 |
| 4,865,123 | 9/1989 | Kawashima et al. | 165/104 |
| 4,941,530 | 7/1990 | Crowe | 165/104 |
| 5,036,908 | 8/1991 | Petroff et al. | 165/104.21 |
| 5,043,797 | 8/1991 | Lopes | 357/82 |
| 5,168,921 | 12/1992 | Meyer, IV | 165/104 |
| 5,199,165 | 4/1993 | Crawford et al. | 29/846 |
| 5,240,069 | 8/1993 | Yerkes | 165/86 |
| 5,409,055 | 4/1995 | Tanaka et al. | 165/104.26 |
| 5,560,423 | 10/1996 | Larson et al. | 165/104.26 |
| 5,579,830 | 12/1996 | Giammaruti | 165/104.33 |

FOREIGN PATENT DOCUMENTS

| | | | |
|---|---|---|---|
| 56-91189 | 7/1981 | Japan | 165/104.14 |
| 58-42261 | 3/1983 | Japan | 165/104.14 |
| 61-130788 | 6/1986 | Japan | 165/104.14 |

*Primary Examiner*—Ira S. Lazarus
*Assistant Examiner*—Terrell McKinnon
*Attorney, Agent, or Firm*—Leydig, Voit & Mayer, Ltd.

[57] ABSTRACT

A heat exchanger for aircraft electronics. The present invention provides a plurality of reflux coolers wherein each reflux cooler is primarily dedicated to cooling a specific electronic component, such as one phase of a multiphase device. The reflux coolers are undersized to adequately cool the individual phases to which each are dedicated, but are interconnected and cross-linked such that the heat dissipation demand is shared amongst the plurality of reflux coolers. Moreover, the heat pipes interconnecting the reflux coolers can be provided with additional surface area in the form of fins to further augment the heat dissipation capacity of the system. Therefore, in the event a single reflux cooler is damaged, for example, during military engagement, the remaining reflux coolers are able to share the load primarily designed to be dissipated by the damaged reflux cooler. Similarly, if one individual phase or component is damaged or lost, and the heat generated by the remaining phases consequently increases, the heat dissipation load placed on the reflux coolers primarily designed for cooling the remaining phases can be communicated to the other reflux coolers and heat pipes to provide an adequate heat rejection path.

16 Claims, 3 Drawing Sheets

REFLUX COOLER COUPLED WITH HEAT PIPES TO ENHANCE LOAD-SHARING

TECHNICAL FIELD

The present invention generally relates to cooling apparatus, and more particularly relates to cooling apparatus for efficiently cooling and dissipating the heat generated by aircraft electronics.

BACKGROUND

Modern aircraft include electronic components to control practically every system provided on the aircraft, including the navigational, cabin pressure and environment, and power systems, as well as the individual elements which comprise those systems. Considering the relative size of the systems needed to operate modern aircraft, the size of the electronic systems, including not only the individual electronic components, but the electrical buses interconnecting the individual electronic components, need to be sized accordingly. Such large electronic components necessarily generate large amounts of heat which need to be dissipated quickly in order to maintain effective operation of the aircraft systems.

In the prior art, attempts to dissipate the heat have included heat exchangers employing conventional heat sinks having a plurality of metal fins or other surface area increasing structures for thermal conduction and dissipation. One problem with such devices, however, is that given the huge demand for heat dissipation of modern aircraft systems, the metal heat sinks must be accordingly sized. This results in a cooling system having excessive weight and space requirements, and thus a less efficient, if not impractical, aircraft.

The prior art therefore has evolved to include thermosyphons to cool the electronic components. As disclosed in U.S. Pat. No. 5,240,069, typical thermosyphons include a liquid coolant which cycles between an evaporator section and a condenser section. The evaporator section is provided in thermal communication with the heat source, in the present application being the aircraft electronics, while the condenser section is provided in thermal communication with a heat sink, such as fins or passing liquid or gaseous coolant, to dissipate the heat. A rotating heat pipe connects the evaporator section to the condenser section such that when the liquid coolant within the evaporator section is heated by the heat source and vaporizes, the vaporized liquid rises to the condenser section wherein the vaporized liquid cools and condenses on the side walls of the heat pipe. The rotation and slant of the heat pipe creates centrifugal force which causes the condensed liquid to flow along the pipe walls back to the evaporator section to continue the cycle.

While such a thermosyphon can certainly dissipate more heat than a system employing extruded metal heat sinks, the heat dissipation burden of modern aircraft electronics, as well as the critical nature of maintaining proper operation of the electronics, dictates the use of multiple thermosyphons for the individual electronic components. For example, if a three phase electric motor drive is to be cooled, a separate thermosyphon is often used to cool each individual phase. This adds additional weight and requires additional space, which the aircraft often cannot provide.

Furthermore, if the aircraft is intended for military use, the thermosyphons will necessarily be subjected to battle damage or loss. It is therefore necessary to oversize the individual thermosyphons to adequately handle the dissipation demand of the other phases in the event that one thermosyphon is damaged or lost. Similarly, if one of the phases should fail or be damaged, the work load of the remaining phases will be increased accordingly. Since prior art systems are designed to have each thermosyphon dedicated to a single phase, the thermosyphons dedicated to the remaining operational phases need to be oversized to handle the additional heat dissipation burden created by the additionally burdened phases. No form of load sharing between the operational thermosyphons currently exists to alleviate this problem.

As disclosed in U.S. Pat. No. 4,951,530, systems have been designed to enhance the heat dissipation capabilities of conventional thermosyphons. Heat fins can be added to the condenser and evaporator sections to thereby increase the total surface area of the heat exchanger. Additionally, the entire thermosyphon can be surrounded by a coolant such as a fluorocarbon to thereby lower the ambient temperature in which the thermosyphon operates. While such systems can increase the heat dissipation capacity of the system, each requires additional space and adds additional weight.

SUMMARY

It is therefore a primary aim of the present invention to provide a heat exchanger which minimizes weight and space requirements, while maximizing heat dissipation capacity.

It is an objective of the present invention to provide a cooling system employing a plurality of heat exchangers connected through a load-sharing arrangement such that when one heat exchanger is damaged, the remaining heat exchangers can adequately handle the increased dissipation demand.

It is another objective of the present invention to provide a cooling system employing a plurality of heat exchangers connected through a load-sharing arrangement such that when one electronic component fails and causes the load on the remaining electronic components to increase, the resulting heat dissipation demand can be communicated not only to the heat exchanger designed to cool the remaining components, but also to the heat exchanger primarily dedicated to the failed component.

In accordance with these objectives, it is a feature of the present invention to provide a system for cooling aircraft electronics including a plurality of reflux coolers which are each undersized to cool the electronic component to which the reflux cooler is primarily dedicated, but which are interconnected through a plurality of heat pipes to allow for heat dissipation load sharing amongst the plurality of reflux coolers. Such a system not only provides for adequate heat dissipation, but also does so in a smaller and lower weight arrangement than that provided by the prior art.

It is another feature of the present invention to provide flat plate heat pipes as the thermal spreaders between the plurality of reflux coolers. To augment the heat dissipation capacity of the system, heat rejection fins can be added across the back side of the heat pipes to reject heat to the ultimate heat sink.

It is still another feature of the present invention to transfer heat amongst the various thermal members using contact pressure with contact conductance enhancements such as grease or Kapton. Alternatively, the thermal members could be bonded together as by brazing, soldering, or adhering with epoxy.

It is a still further feature of the present invention to provide a metal matrix composite to either partially, or entirely, form the heat spreaders. The metal matrix composite has good thermal conductivity, and moreover, has a similar coefficient of thermal expansion to silicon components than do conventional metal, such as aluminum, heat spreaders.

These and other objectives and features will be most completely and beneficially understood as explained in the following detailed description when read and comprehended in conjunction with the accompanying drawings.

While the present invention is described below with reference to certain preferred embodiments, it is to be understood that such embodiments are chosen for the express purpose of disclosing the best mode of the present invention, and should in no way be construed to limit the scope of the invention to such specifically disclosed embodiments. Rather, the present invention is intended to cover all embodiments of the present invention as specifically described herein, reasonably taught hereby, and falling within the scope of the claims appended hereto.

DESCRIPTION OF THE INVENTION

Figure 1:
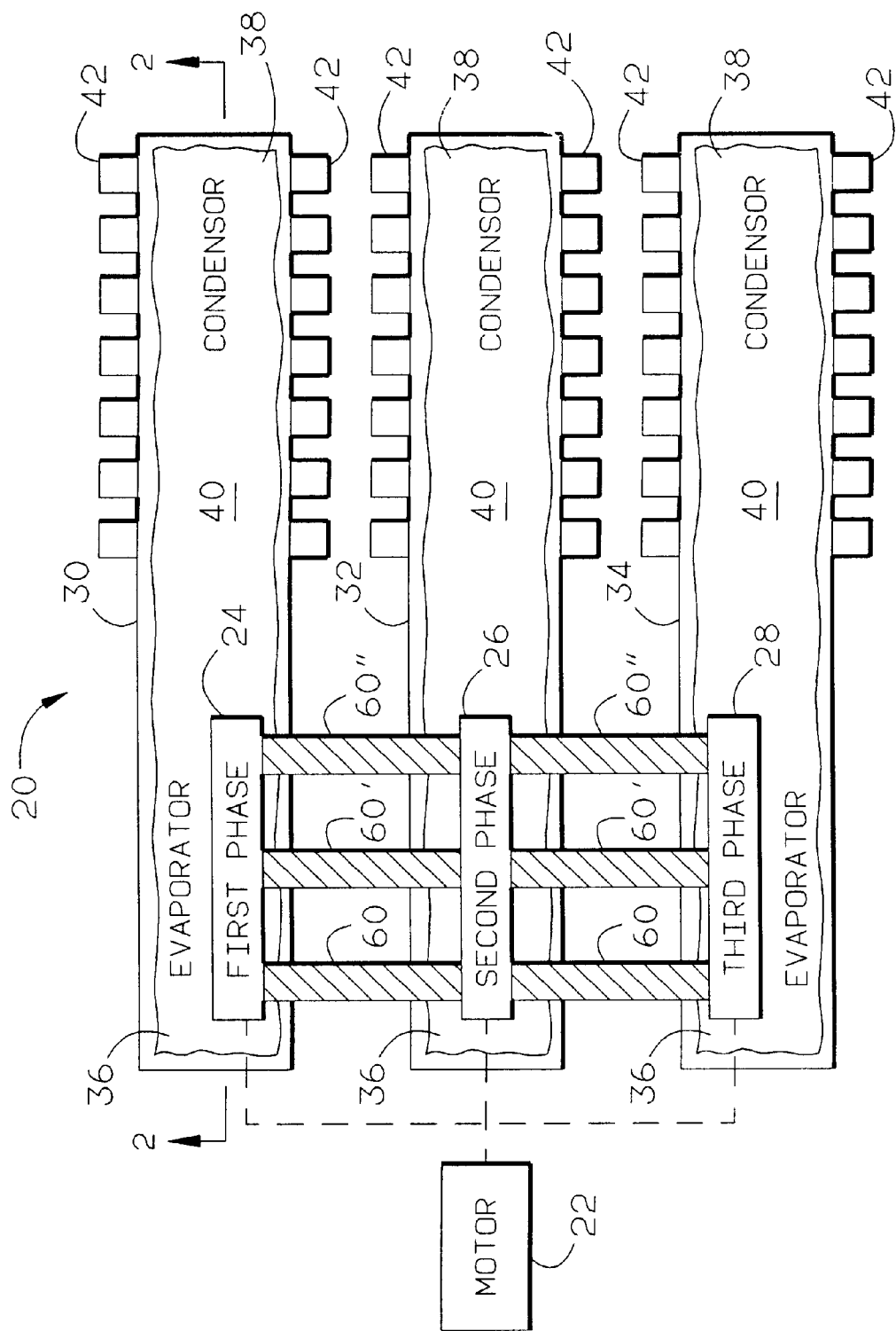
FIG. 1 is a schematic view of the present invention.

Referring now to FIG. 1, the present invention is generally designated as cooling system 20. In the preferred embodiment, system 20 is designed to dissipate the heat generated by three phases of an electrical device. In the embodiment shown in FIG. 1, the electrical device is shown as motor 22 having first phase power electronics 24, second phase power electronics 26, and third phase power electronics 28, but it is to be understood that the present invention is intended for use with any apparatus having a plurality of heat-generating elements having interconnected heat dissipation means.

During the operation of motor 22, first phase 24, second phase 26, and third phase 28 power electronics generate heat. As shown in FIG. 1, a separate reflux cooler is provided proximate each of the phases and is primarily dedicated to the dissipation of heat generated by the phase proximate each reflux cooler. In other words, first reflux cooler 30 is provided proximate first phase 24, second reflux cooler 32 is provided proximate second phase 26, and third reflux cooler 34 is provided proximate third phase 28. Reflux coolers, or thermosyphons, can typically dissipate higher heat fluxes than heat pipes, and therefore are placed in contact with the heat generating devices.

Although not a part of the present invention, for the sake of completeness, it should be noted that each reflux cooler conventionally includes an evaporator section 36, and a condenser section 38, with a working fluid 40 disposed in thermal communication therebetween. The condensation of vapor can occur even in submerged portions of the thermosyphon. The working fluid can be any of a number of coolants, including fluorocarbons such as Freon, fluorine compounds, water, and ethanol, which are able to cycle between a liquid state and a gaseous state. As the electric devices operate and generate heat, the coolant in the evaporator section 36 is heated thereby and is elevated in temperature to the point of vaporization. The gaseous coolant is then communicated to the condenser section 38 at which point the coolant temperature lowers, and the coolant reverts to liquid form for recycling back to the evaporator section. In this way the heat generated by the electrical device is dissipated. In order to enhance the heat dissipation capacity of the system, fins 42 can be provided at condenser section 38 to increase the surface area of the heat pipe. A range of systems can be employed to cause the liquid and gaseous coolant to move from the evaporator section to the condenser section including pressure differentials, absorbent wicks, and conical thermosyphons employing centrifugal force.

Figure 3:
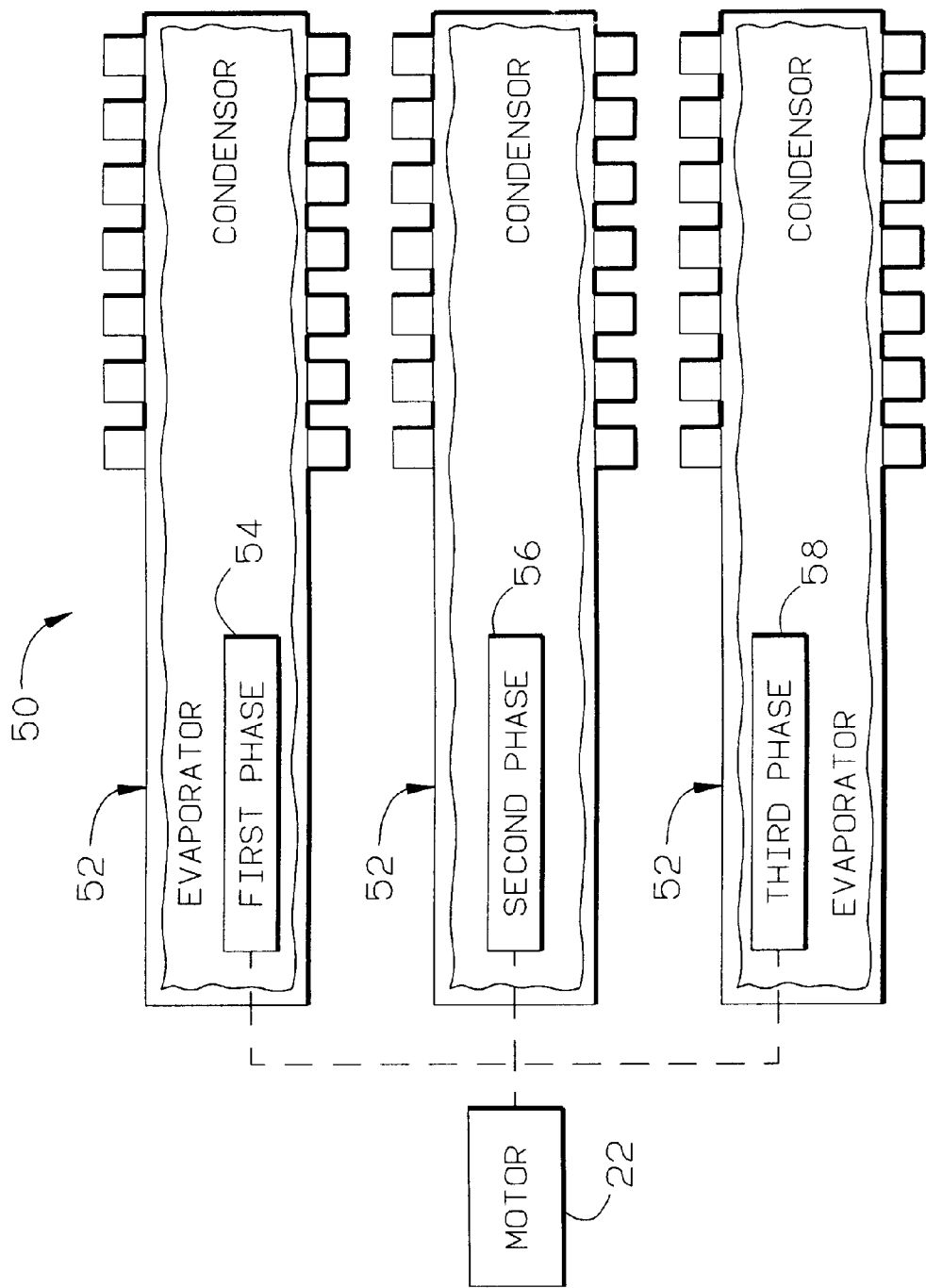
FIG. 3 is a schematic view of a prior art cooling apparatus.

As stated above, one problem associated with prior art devices is that each reflux cooler is sized to be able to dissipate the maximum heat which the associated electrical device can generate. This necessarily results in a large and heavy cooling system which detrimentally affects the efficiency, if not viability, of the aircraft on which they are deployed. As shown in FIG. 3, prior art system 50 has a separate reflux cooler 52 for each of the first, second and third phases, 54, 56, and 58, respectively. As shown therein, however, reflux coolers 54, 56, and 58 are substantially larger than those of the present invention.

This is partially due to the sizing criterion stated above and also because in military aircraft, which is the application to which the present invention is most closely directed, the cooling system must be designed to withstand a certain degree of battle damage and still remain operational. If one reflux cooler is damaged, the remaining coolers need to be sized to sufficiently reject the heat generated by all phases. Similarly, if one of the phases is damaged and causes the remaining phases to operate under an additional burden, the cooler dedicated to the remaining phases must be able to reject the increased heat output of the additionally burdened phases.

With prior art designs such as that shown in FIG. 3, this results in an extremely inefficient system, especially considering that the individual phases often operate at far less than maximum capacity and thus heat output. Since no form of heat load sharing is employed by prior art cooling systems, military aircraft have heretofore been forced to carry excessively sized and heavy cooling systems in anticipation of such possibilities, but at the expense of aircraft efficiency and performance.

Figure 2:
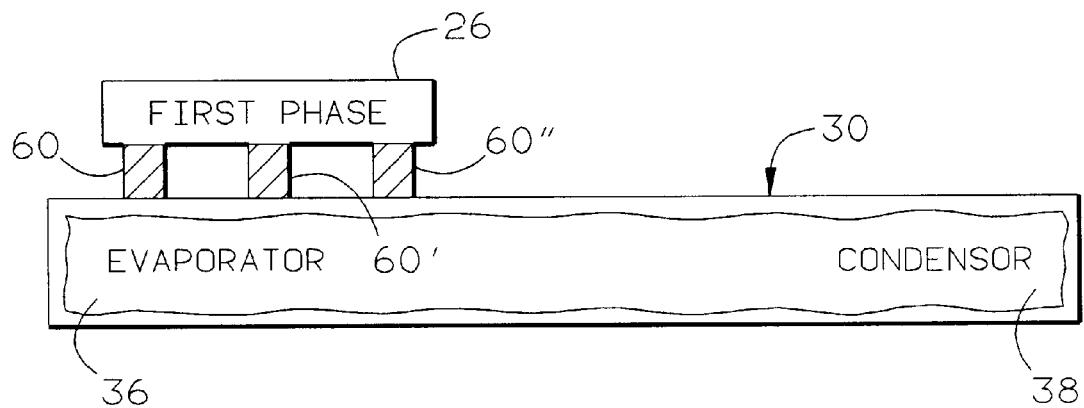
FIG. 2 is a sectional view of the embodiment shown in FIG. 1 taken along line 2—2.

The present invention therefore provides the load-sharing system depicted in FIGS. 1 and 2, wherein heat pipes are provided to thermally connect the reflux coolers. In the preferred embodiment, heat pipes 60 are provided in the form of flat metal plates. In alternative embodiments, some of which are discussed in further detail herein, heat pipes 60 can be formed from metal matrix composites or other materials having good thermal conductivity characteristics. It should also be noted that in the preferred embodiment heat pipes 60 are provided with fins to increase the overall surface area of the heat pipe and thus the heat dissipation capabilities thereof. Although heat pipes can typically dissipate lower heat loads than thermosyphons, they are usually lighter, and thus make an ideal heat spreader in places where heat fluxes are low (i.e., 5–10 W/cm$^2$), such as the condenser of a thermosyphon.

With specific reference to FIG. 1, heat pipes 60, 60' and 60" connect first reflux cooler 30 to second reflux cooler 32, and to third reflux cooler 34. By doing so the heat generated by first phase 24 is not only thermally conducted to first reflux cooler 30, but to second reflux cooler 32 and to third reflux cooler 34 as well. The actual size of each reflux cooler can therefore be substantially reduced relative to the size of prior art coolers. Since the heat dissipation burden of each phase is shared amongst the reflux coolers, the weight and size of the overall system 20 can be reduced, resulting in a more efficient aircraft with enhanced performance. It is also important to note, that although heat pipes 60, 60', and 60" are depicted as being physically disposed between the phases and the reflux coolers, an alternative embodiment provides for the heat pipes to be placed on the outside of the reflux coolers such that the phase electronics are in direct thermal communication with the reflux coolers, and the heat pipes are then provided adjacent to the coolers but not directly between the phases and coolers. In such an embodiment, heat fins are provided on the side of the heat pipes not adjacent to the reflux coolers.

Moreover, as a result of the cross-linkage and interconnected nature of the present invention, if one phase or cooler is damaged in the course of battle, the remaining phases and coolers can adequately reject the resulting heat. For example, if first phase 24 is damaged, the burden on second phase 26 and third phase 28 will increase accordingly. If first reflux cooler 30 were not interconnected to second reflux cooler 32 and third reflux cooler 34, the heat generated by phases 26 and 28 would not be adequately dissipated. However, with the present invention the heat generated by phases 26 and 28 can be dissipated not only to second reflux cooler 32 and third reflux cooler 34, but to first reflux cooler 30 as well. Similarly, if first cooler 30 is damaged, the heat generated by first phase 24 can be thermally communicated to remaining coolers 32 and 34 for proper dissipation. Another example of this occurs when the motor is in a hold mode, during which time a load may be placed on only two of the phases. While each individual cooler is undersized for the maximum heat generated by each phase, and the load placed on the two active phases during the motor hold mode is typically the heaviest load each cooler will have dissipate, since the coolers are interconnected they can load-share and thus dissipate heat through all three coolers and adequately handle the load.

In order to explain the actual connection between the components, attention is now directed to FIG. 2. As shown therein, first reflux cooler 30 is shown with evaporator section 36 proximate first phase 24 to receive the heat generated thereby. Heat pipe 60 is shown disposed between cooler 30 and evaporator 36 to not only communicate the heat generated by first phase 24 to evaporator section 36 of first reflux cooler 30, but to evaporator section 36' of second reflux cooler 32. As stated before, in an alternative embodiment, heat pipes 60 are provided on the side of each cooler opposite the individual phases. The heat pipes are therefore outside the coolers and are provided with surface area increasing fins.

To enhance the thermal conductivity between the elements, a number of mechanisms can be employed. In the embodiment shown in FIG. 1, contact pressure is used to connect the components. Additionally, a contact conductance enhancement such as grease or Kapton® can be disposed therebetween to increase the effectiveness of the heat transfer. Alternatively, the components can be bonded together as by brazing, soldering, or adhering via epoxy.

Figure 4:
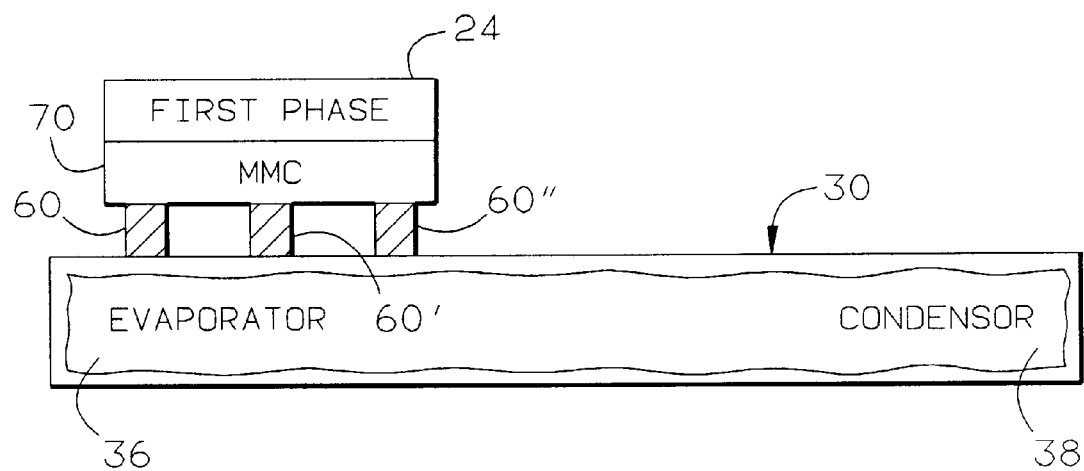
FIG. 4 is a sectional view of an alternative embodiment of the present invention.

In an alternative embodiment of the present invention shown in FIG. 4, a thermal spreader in the form of metal matrix composite sheet 70 is disposed between the electrical phases and the thermosyphons to more effectively distribute the heat generated by the phases amongst the heat pipes and thus amongst the reflux coolers. In its preferred form, metal matrix composite sheet 70 is comprised of aluminum and silicon carbide, although alternative metal matrix composites can be employed with similar efficacy. In a still further embodiment, phase change material is provided within the reflux coolers to enhance thermal energy storage to thereby allow the devices to share thermal storage capacity with adjacent coolers.

It can therefore be seen to one of ordinary skill in the relevant art that the present invention provides a new and improved cooling system for aircraft electronics which dramatically reduces the weight and space requirements of the system by eliminating oversizing of the individual coolers and providing for load sharing between the coolers through interconnecting heat pipes. A plurality of cooling circuits are provided such that even if one element is damaged or fails, the remaining elements can adequately dissipate the heat generated by the components by rerouting the heat path to one or more of the remaining cooling circuits.

Specifically, the present invention provides five distinct cooling circuits. A first cooling circuit is provided between first phase 24 and first reflux cooler 30. The heat generated by first phase 24 is received by the working fluid 40 in evaporator section 36 which causes working fluid 40 to vaporize and be communicated to condenser section 38 for reversion back to liquid form and recycling to evaporator section 36. Similarly, a second cooling circuit is provided between second phase 26 and second reflux cooler 32, while a third cooling circuit is provided for thermal communication between the third phase and third reflux cooler 34.

To allow for the aforementioned load sharing, a fourth cooling circuit and a fifth cooling circuit are also provided. As best shown in FIG. 1, the fourth cooling circuit provides thermal communication between first phase 24 and second reflux cooler 32 as well as thermal communication between second phase 26 and first reflux cooler 30. In the event first reflux cooler 30 should fail, for example, the heat generated by first phase 24 can be dissipated along the fourth cooling circuit. Similarly, the fifth cooling circuit provides thermal communication between second phase 26 and third reflux cooler 34, as well as between third phase 28 and second reflux cooler 32. In the event third phase 28 should fail, for example, and first phase 24 and second phase 26 become additionally burdened, the heat generated thereby can be dissipated through all three reflux coolers, 30, 32, and 34.

While the invention has been described in terms of its preferred embodiment, it should be understood that numerous modifications may be made thereto without departing from the spirit and scope of the present invention. It is intended that the present invention should include not only the specific embodiments disclosed, supra, but also any embodiments equivalent thereto, reasonably taught thereby, or falling within the scope of the appended claims.

We claim:

1. A heat exchanger for cooling a plurality of electronic components, comprising:

a plurality of reflux coolers each having an evaporator section and a condenser section with a working fluid in thermal communication therebetween, each reflux cooler being disposed adjacent one of the plurality of electronic components; and a plurality of heat pipes disposed adjacent the plurality of reflux coolers, the plurality of heat pipes providing thermal communication between the plurality of reflux coolers to thereby spread the heat generated by the plurality of reflux coolers amongst the plurality of reflux coolers and providing a redundant heat exchanging system which enables one of more reflux coolers to fail without causing the electronic components to fail.

2. The heat exchanger of claim 1 wherein the plurality of electronic components include first, second, and third electrical phase buses, the plurality of reflux coolers include first, second and third reflux coolers wherein the first reflux cooler is disposed adjacent the first phase, the second reflux cooler is disposed adjacent the second phase, and third reflux cooler is disposed adjacent the third phase.

3. The heat exchanger of claim 1 wherein the plurality of heat pipes are flat metal bars having fins formed integrally therewith to increase the surface area of the heat pipes and thereby increase the heat dissipation capacity of the heat exchanger.

4. The heat exchanger of claim 1 wherein the plurality of heat pipes are joined to the plurality of reflux coolers using contact pressure and a contact conductance enhancement.

5. The heat exchanger of claim 4 wherein the contact conductance enhancement is selected from the group consisting of grease and Kapton®.

6. The heat exchanger of claim 1 wherein the plurality of heat pipes are joined to the plurality of reflux coolers by brazing.

7. The heat exchanger of claim 1 wherein the plurality of heat pipes are joined to the plurality of reflux cooler by epoxy bonding.

8. The heat exchanger of claim 1 wherein a metal matrix composite is disposed between the plurality of electronic components and the plurality of heat pipes to enhance the distribution of the heat generated by the electronic components amongst the heat pipes.

9. A cooling system for dissipating heat generated by first, second, and third phases of an electrical devices, comprising:
   a first reflux cooler having an evaporator section and a condensing section with a working fluid disposed therebetween and providing a first cooling circuit, the first reflux cooler evaporator section being disposed proximate the first phase of the electrical device, and adapted to receive heat generated by the first phase of the electrical device to cause the working fluid to vaporize and be communicated to the condenser section for reversion into a liquid for recycling back to the evaporator section;
   a second reflux cooler having an evaporator section and a condensing section with a working fluid disposed therebetween and providing a second cooling circuit, the second reflux cooler evaporator section being disposed proximate the second phase of the electrical device and adapted to receive heat generated by the second phase of the electrical device to cause the working fluid to vaporize and be communicated to the condenser section for reversion into a liquid for recycling back to the evaporator section;
   a third reflux cooler having an evaporator section and a condensing section with a working fluid disposed therebetween and providing a third cooling circuit, the third reflux cooler evaporator section being disposed proximate the third phase of the electrical device and adapted to receive heat generated by the third phase of the electrical device to cause the working fluid to vaporize and be communicated to the condenser section for reversion into a cooled liquid for recycling back to the evaporator section;
   a first heat pipe disposed adjacent the first cooling circuit and the second cooling circuit to form a fourth cooling circuit, the fourth cooling circuit communicating heat generated by the first phase to the second cooling circuit, and heat generated by the second phase to the first cooling circuit; and
   a second heat pipe disposed adjacent the second cooling circuit and the third cooling circuit to form a fifth cooling circuit, the fifth cooling circuit communicating heat generated by the second phase to the third cooling circuit, and heat generated by the third phase to the second cooling circuit.

10. The cooling system of claim 9, wherein the first and second heat pipes are flat metal bars having fins formed integrally therewith to increase the surface area of the heat pipes and thereby increase the heat dissipation capacity of the cooling system.

11. The cooling system of claim 9 wherein the first heat pipe is joined to the first and second reflux coolers, and the second heat pipe is joined to the second and third reflux coolers using contact pressure and a contact conductance enhancement to enhance the thermal conductivity therebetween.

12. The cooling system of claim 11 wherein the contact conductance enhancement is selected from the group consisting of grease and Kapton®.

13. The cooling system of claim 9 wherein the first heat pipe is joined to the first and second reflux coolers, and the second heat pipe is joined to the second and third reflux coolers by brazing.

14. The cooling system of claim 9 wherein the first heat pipe is joined to the first and second reflux coolers, and the second heat pipe is joined to the second and third reflux coolers by epoxy bonding.

15. The cooling system of claim 9 wherein a metal matrix composite is disposed between the first phase and the first reflux cooler, the second phase and the second reflux cooler, and the third phase and the third reflux cooler to enhance the distribution of the heat generated by the first, second and third phases amongst the first, second, and third reflux coolers.

16. A method for cooling first, second, and third phases of an electrical device through first, second, and third reflux coolers wherein the first reflux cooler is primarily dedicated to rejecting heat generated by the first phase but is incapable of rejecting all the heat generated by the first phase, the second reflux cooler is primarily dedicated to rejecting heat generated by the second phase but is incapable or rejecting all the heat generated by the second phase, and the third reflux cooler is primarily dedicated to rejecting heat generated by the third phase but is incapable of rejecting all the heat generated by the third phase, the method comprising the steps of:
   rejecting heat generated by the first phase along a first cooling circuit providing thermal communication between the first phase and the first reflux cooler;
   rejecting heat generated by the second phase along a second cooling circuit providing thermal communication between the second phase and the second reflux cooler;
   rejecting heat generated by the third phase along a third cooling circuit providing thermal communication between the third phase and the third reflux cooler;
   rejecting heat generated by the first phase along a fourth cooling circuit providing thermal communication between the first phase and the second reflux cooler;
   rejecting heat generated by the second phase along a fourth cooling circuit providing thermal communication between the second phase and the first reflux cooler;
   rejecting heat generated by the second phase along a fifth cooling circuit providing thermal communication between the second phase and the third reflux cooler; and
   rejecting heat generated by the third phase along a fifth cooling circuit providing thermal communication between the third phase and the second reflux cooler.

* * * * *